(12) United States Patent
Han et al.

(10) Patent No.: US 7,612,409 B2
(45) Date of Patent: Nov. 3, 2009

(54) ORGANIC THIN FILM TRANSISTOR COMPRISING DEVICE INSULATION FILM AND METHOD OF MANUFACTURING THE SAME

(75) Inventors: Chang Wook Han, Seoul (KR); Hee Suk Pang, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/319,563

(22) Filed: Dec. 29, 2005

(65) Prior Publication Data
US 2006/0284253 A1 Dec. 21, 2006

(30) Foreign Application Priority Data
Jun. 20, 2005 (KR) ........................ 10-2005-0052994

(51) Int. Cl.
H01L 27/12 (2006.01)
H01L 51/00 (2006.01)

(52) U.S. Cl. .................. 257/347; 257/40; 257/E51.005; 438/99; 438/158

(58) Field of Classification Search .................. 257/40, 257/213, 288, 347, 352, E51.003, E51.004, 257/E51.005, E51.006; 438/99, 142, 149–166

See application file for complete search history.

(56) References Cited

U.S. PATENT DOCUMENTS

| | | | | |
|---|---|---|---|---|
| 4,599,241 | A | * | 7/1986 | Nakaboh et al. ............... 438/16 |
| 5,287,208 | A | * | 2/1994 | Shimoto et al. ............. 349/123 |
| 6,133,051 | A | * | 10/2000 | Hintermaier et al. ........... 438/3 |
| 6,217,793 | B1 | * | 4/2001 | Totani et al. ........... 252/299.62 |
| 6,458,416 | B1 | * | 10/2002 | Derderian et al. ........... 427/301 |
| 6,650,387 | B1 | * | 11/2003 | Asao et al. .................. 349/133 |
| 2004/0161873 | A1 | * | 8/2004 | Dimitrakopoulos et al. ... 438/99 |
| 2005/0057136 | A1 | * | 3/2005 | Moriya et al. ................ 313/311 |
| 2005/0156161 | A1 | * | 7/2005 | Hanna et al. ................... 257/40 |

FOREIGN PATENT DOCUMENTS

KR 2004-0067047 7/2004
KR 1020040067047 A * 7/2004

* cited by examiner

Primary Examiner—Sue Purvis
Assistant Examiner—Kevin Quinto
(74) Attorney, Agent, or Firm—Morgan Lewis & Bockius LLP

(57) ABSTRACT

An organic thin film transistor (OTFT) includes a substrate, a gate electrode formed on the transparent substrate, a gate insulation film formed on the gate electrode, a source electrode and a drain electrode formed spaced apart from each other on the gate insulation film, a device insulation film formed over the gate, source, and drain electrodes, and an organic semiconductor film formed on the device insulation film.

7 Claims, 3 Drawing Sheets

ORGANIC THIN FILM TRANSISTOR COMPRISING DEVICE INSULATION FILM AND METHOD OF MANUFACTURING THE SAME

This application claims the benefit of the Korean Patent Application No. 2005-052994 filed on Jun. 20, 2005, which is hereby incorporated by reference.

BACKGROUND OF THE INVENTION

1. Field of the Invention

The present invention relates to an organic thin film transistor and method of manufacturing the same, and more particularly, to an organic thin film transistor having a low driving voltage and a good carrier mobility and method of manufacturing the same.

2. Discussion of the Related Art

A thin film transistor ("TFT") device used as a switching element of a liquid crystal display ("LCD") apparatus generally includes an active layer made of amorphous silicon or polysilicon. However, an organic thin film transistor (hereinafter, referred to as "OTFT") in which the active layer is formed using an organic semiconductor material has recently been introduced as a substitute for amorphous or polysilicon based TFTs.

In particular, the active layer of the OTFT is formed by depositing an organic semiconductor material using a spin coating method or a vacuum deposition method. Advantages of OTFTs include low temperature deposition capabilities, process flexibility, relatively easy processing, and the like.

FIG. 1 is a sectional view of a related OTFT. The related OTFT includes a transparent substrate 10, a gate electrode 11, a gate insulation film 12, a source electrode 13, a drain electrode 14, and an organic semiconductor film 15. The organic semiconductor film 15 is comprised of an organic semiconductor material having a large grain size, such as pentacene.

An OTFT formed using pentacene has good mobility characteristics having the same level as an amorphous silicon TFT and is very stable in the air. However, the OTFT having the structure shown in FIG. 1 has draw backs when being used as a switching element (or a general purpose semiconductor device) in an LCD apparatus because of a high gate-source voltage (Vgs) and low carrier mobility. In particular, pentacene, which is usually used to form the organic semiconductor film 15, is influenced significantly by the characteristics of the gate insulation film 12. As a result, the grain size of pentacene forming the organic semiconductor film 15 does not grow very large during fabrication due to the gate insulation film 12, thereby producing poor carrier mobility.

To solve this problem, Korean Patent Publication No. 2004-0067047 proposes techniques in which the organic semiconductor film is deposited using spin coating. In an organic light emitting diode (OLED), driving voltage is decreased while carrier mobility is improved because one of the multi-layer structures between two electrodes in an OLED is made of a lithium fluoride (LiF) insulation film. Therefore, such principle is applied to the OTFT in the related art by adding the LiF insulation film to the OTFT.

However, the related art device also suffers from various limitations. For instance, the thickness of the organic semiconductor film is relatively large—i.e., about 4000 Å (angstroms) or higher, due as a result of the spin coating process. Accordingly, the related art method has problems in that the tunneling effect of carriers generated is limited, and, as a result, a high driving voltage is required.

SUMMARY OF THE INVENTION

Accordingly, the present invention is directed to an organic thin film transistor ("OTFT"), and a method of manufacturing the same, that substantially obviates one or more problems due to limitations and disadvantages of the related art.

An object of the present invention to provide an OTFT that is very thin, has a low driving voltage, and has good carrier mobility.

Another object of the present invention to provide an OTFT in which an organic semiconductor film having a large grain size is formed.

Yet another object of the present invention is to provide a method of fabricating an OTFT of the present invention in an efficient manner.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic thin film transistor (OTFT) includes a substrate, a gate electrode formed on the transparent substrate, a gate insulation film formed on the gate electrode, a source electrode and a drain electrode formed spaced apart from each other on the gate insulation film, a device insulation film formed over the gate, source, and drain electrodes, and an organic semiconductor film formed on the device insulation film.

In another aspect, a method of fabricating an organic thin film transistor (OTFT) includes the steps of forming a gate electrode on a transparent substrate, forming a gate insulation film on the gate electrode, forming a source electrode and a drain electrode spaced apart from each other on the gate insulation film, forming a device insulation film over the gate, source, and drain electrodes, and forming an organic semiconductor film on the device insulation film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Figure 1:
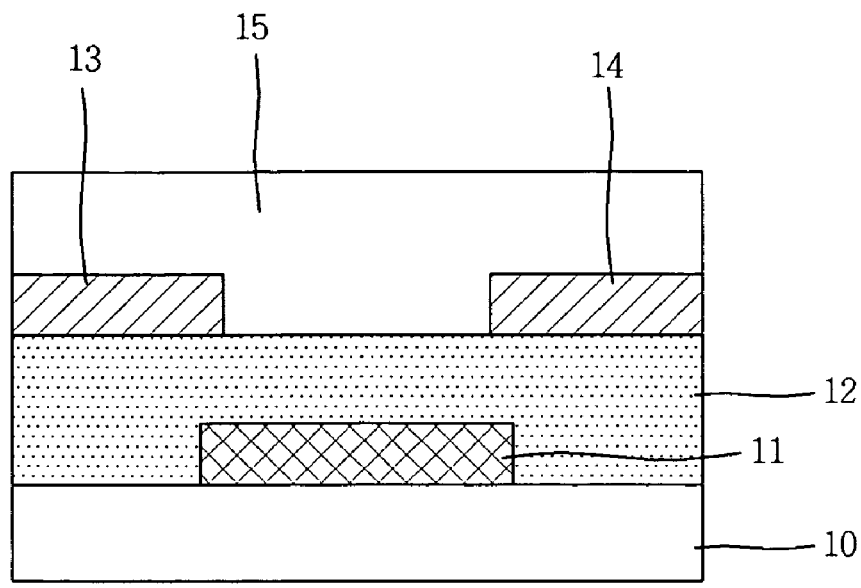
FIG. 1 is a sectional view of a related organic thin film transistor (OTFT)

Reference will now be made in detail to the preferred embodiments of the present invention, examples of which are illustrated in the accompanying drawings. Like reference numerals are used to identify the same or similar parts.

Figure 2:
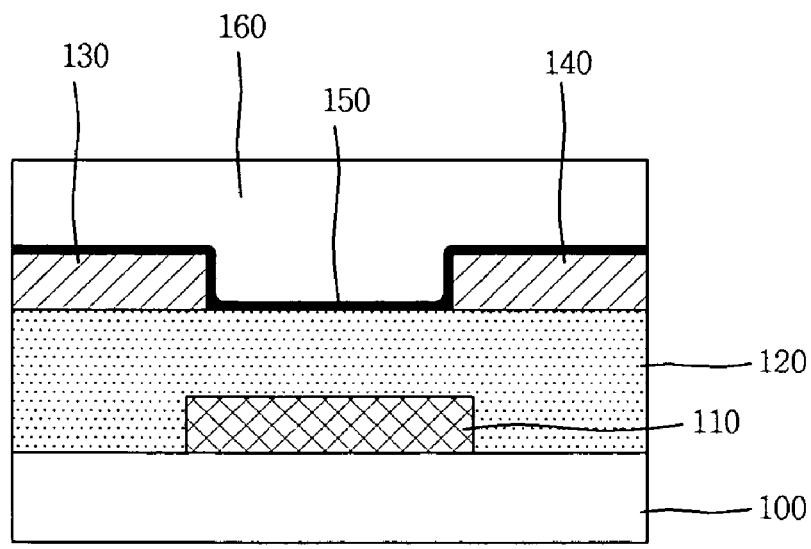
FIG. 2 is a sectional view of an OTFT according to an exemplary embodiment of the present invention.

FIG. 2 is a sectional view of an organic thin film transistor (OTFT) according to an exemplary embodiment of the present invention. As shown in FIG. 2, the OTFT according to the exemplary embodiment of the present invention is a bottom contact type, and includes a transparent substrate 100, a gate electrode 110, a gate insulation film 120, a source electrode 130, a drain electrode 140, a device insulation film 150, and an organic semiconductor film 160.

In particular, the gate electrode 110 is formed on the transparent substrate 100 using a metal such as aluminum. The gate insulation film 120 is formed in a region covering the gate electrode 110 using an insulation material such as a silicon nitride film (SiNx) or a silicon oxide film (SiOx). The source electrode 130 and the drain electrode 140 are formed on the gate insulation film 120 separated from the other, and they are formed using a metal such as aluminum, chrome, and the like.

The device insulation film 150 is formed to a thickness of 900 Å (angstroms) or less in a region covering the source electrode 130 and the drain electrode 140. The device insulation film may be formed using an inorganic material such as silicon oxide ($SiO_2$), silicon nitride (SiNx), titania ($TiO_2$), and alumina ($Al_2O_3$), or polymer organic material such as polyimide, benzocyclobutene (BCB), and photo acryl. In the case where the device insulation film 150 is made of polymer organic material, the organic semiconductor film 160 deposited on the device insulation film 150 can be grown well by rubbing the device insulation film 150 in one direction.

More specifically, if the device insulation film 150 of several angstoms (Å) to hundreds of angstoms (Å) is rubbed in a direction perpendicular to the source electrode 130 and the drain electrode 140 (rubbed using nylon fabric or irradiated with deflected ultraviolet rays), the alignment of the organic semiconductor film 160 deposited on the device insulation film 150 facilitates carrier transport. This results in increased carrier mobility, thereby improving performance significantly. Thereafter, the organic semiconductor film 160 is formed on the device insulation film 150 using polymer organic material such as pentacene having a large grain size.

In the OTFT according to the present invention, the device insulation film 150 is provided between the organic semiconductor film 160 and the source/drain electrodes 130 and 140 as shown in FIG. 2. A thickness of the device insulation film 150 located between the organic semiconductor film 160 and the source/drain electrodes 130 and 140 may be several angstoms (Å) to hundreds of angstoms (Å), preferably 900 Å or less. In particular, the device insulation film 150 having a thickness as small as about 10 Å can be achieved through chemical vapor deposition (CVD) or atomic layer deposition (ALD).

Figure 3:
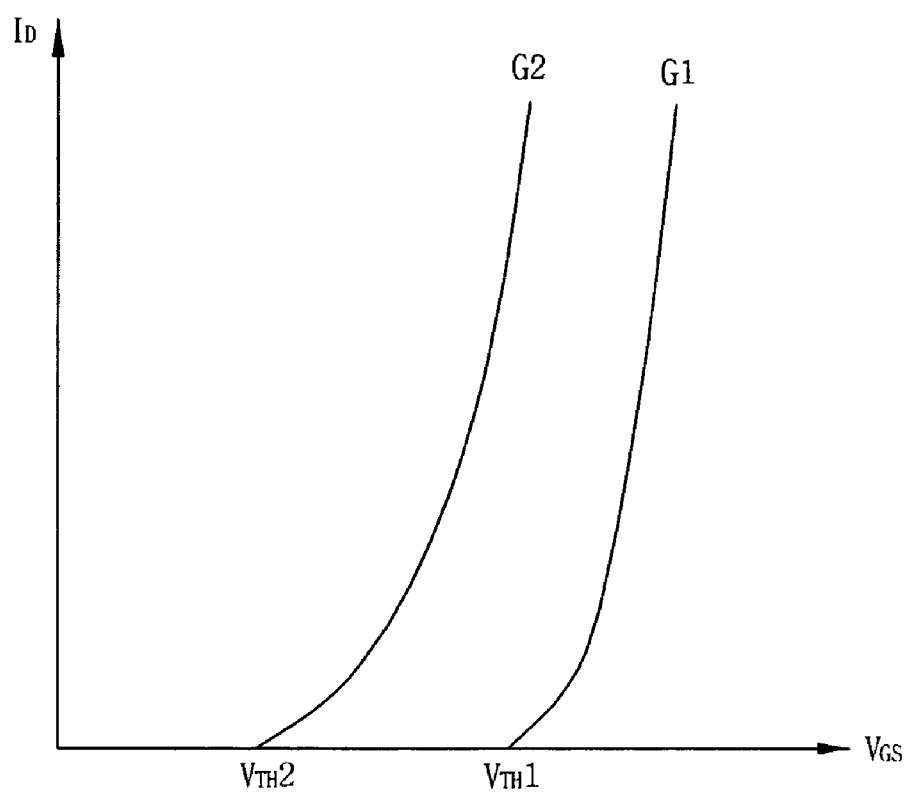
FIG. 3 is a characteristic graph showing the relation between the gate voltage and the drain current of the exemplary OTFT shown in FIG. 2.

FIG. 3 is a characteristic graph showing the relationship between the gate voltage and the drain current of the OTFT according to the present invention as shown in FIG. 2. FIG. 3 shows that if a thin device insulation film 150 is inserted between the organic semiconductor film 160 and the source/drain electrodes 130 and 140, a voltage-current characteristic of the OTFT changes from G1 to G2, which has a gentler inclination curve than that of G1. As shown in FIG. 3, the threshold voltage also decreases from $V_{TH}1$ to $V_{TH}2$. Since the charge injection characteristic are improved due to the tunneling effect, the drain-source voltage (Vds) deceases and the carrier mobility improves.

Thus, the OTFT according to the exemplary embodiment of the present invention has a decreased gate-source voltage (Vgs), thereby reducing the driving voltage needed for operation. Further, since the drain-source voltage (Vds) against the same driving voltage is reduced by the tunneling effect through the thin device insulation film 150, the carrier mobility is also enhanced.

Figure 4:
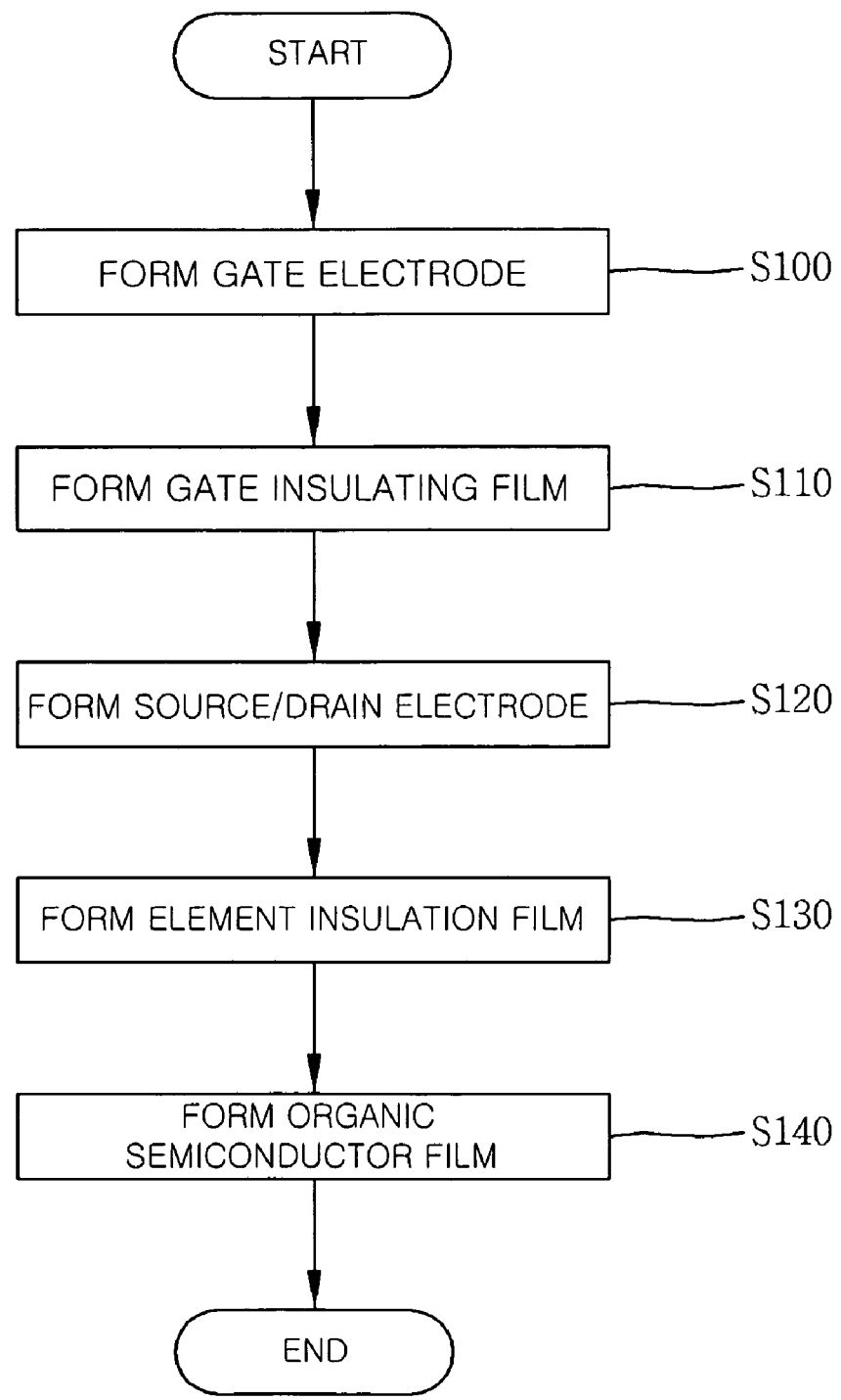
FIG. 4 is a flowchart illustrating an exemplary method of fabricating an OTFT according to the exemplary embodiment of the present invention.

FIG. 4 is a flowchart illustrating an exemplalry method of fabricating an OTFT according to the exemplary embodiment of the present invention. At step S100, the gate electrode 110 is formed on the transparent insulation substrate 100. At step S110, the gate insulation film 120 is formed in a region covering the gate electrode 110. At step S120, the source electrode 130 and the drain electrode 140 are formed on the gate insulation film 120 separated from each other. As step S130, the device insulation film 150 is formed in a region covering the source electrode 130 and the drain electrode 140 having a thickness of about 900 Å or less. The device insulation film 150 is formed using inorganic material such as silicon oxide ($SiO_2$), silicon nitride (SiNx), titania ($TiO_2$), and alumina ($Al_2O_3$), or polymer organic material such as polyimide, benzocyclobutene (BCB), and photo acryl. Finally, at step S140, the organic semiconductor film 160 is formed on the device insulation film 150.

To form the device insulation film 150 having a thickness of about 900 Å or less, vacuum deposition such as CVD or ALD may be employed. The device insulation film 150 can be formed having a thickness as small as about 10 Å through vacuum deposition.

In the event that the device insulation film 150 is formed of the polymer organic material, the device insulation film 150 may be rubbed in one direction so as to enhance the carrier mobility. As a result, when pentacene is used to form the organic semiconductor film 160, pentacene having a large grain size may be grown well on the device insulation film 150. In particular, one of the directions along which rubbing is performed can be a direction perpendicular to the source electrode 130 and the drain electrode 140.

The OTFT according to the present invention constructed in the manner described above includes an organic semiconductor film having a large grain size and a low driving voltage with good carrier mobility. Furthermore, the OTFT of the present invention can be efficiently fabricated in accordance with the method of fabricating the OTFT as described above.

It will be apparent to those skilled in the art that various modifications and variations can be made in the OTFT of the present invention and the method of fabricating the same without departing form the spirit or scope of the invention. Thus, it is intended that the present invention cover the modifications and variations of this invention provided they come within the scope of the appended claims and their equivalents.

What is claimed is:

1. An organic thin film transistor (OTFT), comprising:
   a transparent substrate;
   a gate electrode formed on the substrate;
   a gate insulation film formed on the gate electrode;
   a source electrode and a drain electrode formed spaced apart from each other on the gate insulation film;
   a device insulation film directly formed on an exposed surface of the gate insulation film and entire upper surfaces of the source and drain electrodes, wherein the device insulation film includes one of a silicon oxide, silicon nitride, titania, and alumina, and wherein a thickness of the device insulation film ranges from about 10 Å (angstroms) to about 900 Å (angstroms); and an organic semiconductor film directly formed on the entire upper surface of the device insulation film.

2. The OTFT according to claim 1, wherein the device insulation film is formed by one of a chemical vapor deposition process or an atomic layer deposition process.

3. A method of fabricating an organic thin film transistor (OTFT), comprising the steps of:

forming a gate electrode on a transparent substrate;
forming a gate insulation film on the gate electrode;
forming a source electrode and a drain electrode spaced apart from each other on the gate insulation film;
directly forming a device insulation film on an exposed surface of the gate insulation film and entire upper surfaces of the source and drain electrodes, wherein the device insulation film includes one of a silicon oxide, silicon nitride, titania, and alumina, and wherein a thickness of the device insulation film ranges from about 10 Å (angstroms) to about 900 Å (angstroms); and
directly forming an organic semiconductor film on the entire upper surface of the device insulation film.

4. The method according to claim 3, wherein the device insulation film is formed by either a chemical vapor deposition process or an atomic layer deposition process.

5. A method of fabricating an organic thin film transistor (OTFT), comprising the steps of:

forming a gate electrode on a transparent substrate;
forming a gate insulation film on the gate electrode;
forming a source electrode and a drain electrode spaced apart from each other on the gate insulation film;
directly forming a device insulation film on an exposed surface of the gate insulation film and entire upper surfaces of the source and drain electrodes to enhance a carrier mobility by either a chemical vapor deposition process or an atomic layer deposition process, wherein the device insulation film includes a benzocyclobutene, and wherein a thickness of the device insulation film ranges from about 10 Å (angstroms) to about 900 Å (angstroms); and
directly forming an organic semiconductor film on the entire upper surface of the device insulation film.

6. The method according to claim 5, further comprising the step of rubbing the device insulation film in one direction after forming the device insulation film.

7. The method according to claim 6, wherein the device insulation film is rubbed in a direction perpendicular to the source electrode and the drain electrode.

* * * * *